(12) United States Patent
Chowdhury et al.

(10) Patent No.: US 8,937,338 B2
(45) Date of Patent: Jan. 20, 2015

(54) CURRENT APERTURE VERTICAL ELECTRON TRANSISTORS WITH AMMONIA MOLECULAR BEAM EPITAXY GROWN P-TYPE GALLIUM NITRIDE AS A CURRENT BLOCKING LAYER

(75) Inventors: Srabanti Chowdhury, Goleta, CA (US); Ramya Yeluri, Santa Barbara, CA (US); Christophe Hurni, Goleta, CA (US); Umesh K. Mishra, Montecito, CA (US); Ilan Ben-Yaacov, Goleta, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 13/527,885

(22) Filed: Jun. 20, 2012

(65) Prior Publication Data

US 2012/0319127 A1    Dec. 20, 2012

Related U.S. Application Data

(60) Provisional application No. 61/499,076, filed on Jun. 20, 2011, provisional application No. 61/583,015, filed on Jan. 4, 2012.

(51) Int. Cl.
| | | |
|---|---|---|
| *H01L 29/778* | (2006.01) | |
| *H01L 29/66* | (2006.01) | |
| *H01L 29/861* | (2006.01) | |
| *H01L 29/417* | (2006.01) | |
| *H01L 29/06* | (2006.01) | |
| *H01L 29/20* | (2006.01) | |

(52) U.S. Cl.
CPC .... *H01L 29/66204* (2013.01); *H01L 29/66462* (2013.01); *H01L 29/7788* (2013.01); *H01L 29/861* (2013.01); *H01L 29/41766* (2013.01); *H01L 29/0646* (2013.01); *H01L 29/2003* (2013.01)
USPC ......................................................... 257/194

(58) Field of Classification Search
CPC ........................ H01L 29/7788; H01L 29/7802
See application file for complete search history.

(56) References Cited

U.S. PATENT DOCUMENTS

| | | | | |
|---|---|---|---|---|
| 5,777,350 | A | * | 7/1998 | Nakamura et al. ............. 257/96 |
| 2003/0045120 | A1 | | 3/2003 | Hu et al. |
| 2005/0163179 | A1 | * | 7/2005 | Hooper et al. .................. 372/45 |
| 2008/0014667 | A1 | * | 1/2008 | Hooper et al. .................. 438/31 |
| 2008/0164461 | A1 | | 7/2008 | Wilson |
| 2010/0163929 | A1 | * | 7/2010 | Ohki ............................. 257/194 |

(Continued)

OTHER PUBLICATIONS

Ben-Yaacov et al., "AlGaN/GaN current aperture vertical electron transistors with regrown channels", Journal of Applied Physics, vol. 95, Num. 4, Feb. 15, 2004, pp. 2073-2078, American Institute of Physics.*

(Continued)

*Primary Examiner* — Andy Huynh
*Assistant Examiner* — Sitaramarao S Yechuri
(74) *Attorney, Agent, or Firm* — Gates & Cooper LLP

(57) ABSTRACT

A current aperture vertical electron transistor (CAVET) with ammonia ($NH_3$) based molecular beam epitaxy (MBE) grown p-type Gallium Nitride (p-GaN) as a current blocking layer (CBL). Specifically, the CAVET features an active buried Magnesium (Mg) doped GaN layer for current blocking purposes. This structure is very advantageous for high power switching applications and for any device that requires a buried active p-GaN layer for its functionality.

19 Claims, 15 Drawing Sheets

(56) References Cited

U.S. PATENT DOCUMENTS

2011/0049526 A1 3/2011 Chu et al.
2011/0084284 A1* 4/2011 Zhang et al. ............... 257/77

OTHER PUBLICATIONS

Ben-Yaacov et al., "AlGaN/GaN current aperture vertical electron transistors with regrown channels", Journal of Applied Physics, vol. 95, No. 4, Feb. 15, 2004, pp. 2073-2078.

Ben-Yaacov et al., "AlGaN/GaN Current Aperture Vertical Electron Transistors". University of California, Santa Barbara, Dissertation, Mar. 2004, 151 pgs.

Dora, "Understanding material and process limits for high breakdown voltage AlGaN/GaN HEMTs". University of California, Santa Barbara, Dissertation, Mar. 2006, 158 pgs.

Huang, "Characterizing the "Current Blocking Layer" of a CAVET". UCSB Apprentice Researchers 2008, Jul. 12, 2008, 22 pgs.

Pei et al., "S5, X, and Ka Band Power Performance of AlGaN/GaN HEMTs Grown by Ammonia MBE". 2008 Electronic Materials Conference (2008), Abstract, one page.

PCT International Search Report dated Sep. 7, 2012 for application No. PCT/US12/43250.

Chowdhury, S., et al., "Enhancement and Depletion Mode AlGaN/GaN CAVET with Mg-Ion Implanted GaN as Current Blocking Layer", IEEE Electron Device Letters, vol. 29, No. 6, pp. 543-545, Jun. 2008.

Chowdhury, S., "AlGaN/GaN CAVETs for high power switching application—a Dissertation submitted in partial satisfaction of the requirements for the degree Doctor of Philosophy in Electrical and Computer Engineering", University of California, Santa Barbara, Dec. 2010, including the following pp. cover, iii, viii-xiv, and 154-155.

Chowdhury, S., et al., "Dispersion-free AlGaN/GaN CAVET with low Ron achieved with plasma MBE regrown channel with Mg-ion-implanted current blocking layer", IEEE, DRC, Jun. 2010.

Hurni, C. A., et al., "p-n junctions on Ga-face GaN grown by NH3 molecular beam epitaxy with low ideality factors and low reverse currents", Applied Physics Letters, vol. 97, 222113, Nov. 2010.

* cited by examiner

Measured on a zero-aperture device

CURRENT APERTURE VERTICAL ELECTRON TRANSISTORS WITH AMMONIA MOLECULAR BEAM EPITAXY GROWN P-TYPE GALLIUM NITRIDE AS A CURRENT BLOCKING LAYER

CROSS REFERENCE TO RELATED APPLICATIONS

This application claims the benefit under 35 U.S.C. Section 119(e) of the following and commonly-assigned U.S. Provisional Patent Applications:

U.S. Provisional Patent Application Ser. No. 61/499,076, filed on Jun. 20, 2011, by Srabanti Chowdhury, Ramya Yeluri, Christophe Hurni, Umesh K. Mishra, and Ilan Ben-Yaacov, entitled "CURRENT APERTURE VERTICAL ELECTRON TRANSISTORS WITH AMMONIA MOLECULAR BEAM EPITAXY GROWN P-TYPE GALLIUM NITRIDE AS A CURRENT BLOCKING LAYER"; and U.S. Provisional Patent Application Ser. No. 61/583,015, filed on Jan. 4, 2012, by Srabanti Chowdhury, Ramya Yeluri, Christophe Hurni, Umesh K. Mishra, and Ilan Ben-Yaacov, entitled "CURRENT APERTURE VERTICAL ELECTRON TRANSISTORS WITH AMMONIA MOLECULAR BEAM EPITAXY GROWN P-TYPE GALLIUM NITRIDE AS A CURRENT BLOCKING LAYER", both of which applications are incorporated by reference herein.

BACKGROUND OF THE INVENTION

1. Field of the Invention

The invention is related generally to the field of electronic devices, and more particularly, to current aperture vertical electron transistors (CAVETs) with ammonia ($NH_3$) molecular beam epitaxy (MBE) grown p-type Gallium Nitride (GaN) as a current blocking layer (CBL).

2. Description of the Related Art (Note: This application references a number of different publications as indicated throughout the specification by one or more reference numbers within brackets, e.g., [x]. A list of these different publications ordered according to these reference numbers can be found below in the section entitled "References." Each of these publications is incorporated by reference herein.)

FIG. 1 is a schematic illustration of a CAVET 100, including higher/heavily n-type doped Gallium Nitride ($n^+$-GaN) 102, lower or lightly n-type doped GaN ($n^-$-GaN) 104, aperture 106, Current Blocking Layer (CBL), unintentionally doped (UID) GaN 108, aluminum gallium nitride (AlGaN) 110, source 112, gate 114, and drain 116. The CAVET 100 is a vertical device comprised of an n-type doped drift region 118 to hold voltage and a horizontal two-dimensional electron gas (2DEG) 120 to carry current flowing from the source 112, under a planar gate 114, and then in a vertical direction to the drain 116 through an aperture 106.

As shown in FIG. 1, electrons flow horizontally from the source 112 through the 2DEG (dashed lines 120), and then vertically through the aperture region 106 to the drain 116, and are modulated by the gate 114. A fundamental part of a CAVET is the CBL, which blocks the flow of the current and causes on-state current to flow through the aperture 106.

Previously, the CBL has been fabricated by ion implantation. For example, two prior art designs of a CBL in a CAVET are described below:

1. AlGaN/GaN CAVETs with Aluminum (Al) ion implanted GaN as the CBL [1]; and

2. AlGaN/GaN CAVETs with Magnesium (Mg) ion implanted GaN as the CBL [2].

In both prior art designs, functioning devices have been achieved by successfully blocking the current from flowing through the CBL region by the use of an ion-implanted GaN layer as a CBL region. The damaged (trap-filled) CBL region introduced a barrier to the electrons injected from the source, thereby preventing the electrons from flowing directly into the drain without passing under the gate.

Nonetheless, there is a need in the art for improvements in CAVET designs. The present invention satisfies that need.

SUMMARY OF THE INVENTION

To overcome the limitations in the prior art described above, and to overcome other limitations that will become apparent upon reading and understanding the present specification, the present invention discloses a CAVET including an aperture region in a III-nitride current blocking layer, wherein a barrier to electron flow through the III-nitride CBL is at least 1 or 2 electron-Volt(s).

The III-nitride CBL can be an active p-type doped III-nitride layer, such as an active p-type GaN layer or an active Magnesium doped layer. The aperture region can comprise n-type GaN.

The CBL can cause on-state current to flow through the aperture region.

The CBL's thickness (e.g., at least 10 nanometers (nm)), hole concentration, and composition, can be such that the barrier to electron flow has the desired value (e.g., at least 1 electron volt).

The device can further comprise an active region comprising a two dimensional electron gas confined in a GaN layer by an AlGaN barrier layer; a source contact to the GaN layer and the AlGaN barrier layer; a drift region, comprising one or more n-type GaN layers, wherein the CBL is between the drift region and the active region; a drain contact to the drift region, and a gate positioned on or above the active region and the aperture, to modulate a current between the source and the drain.

The n-type III-nitride drift region can be between the aperture region and the drain. An n-type doping concentration in the drift region can be less than an n-type doping concentration in the aperture region.

The source and the CBL can be electrically connected such that in operation there is no bias between the source and the CBL.

The present invention further discloses a III-nitride CAVET, comprising a current blocking layer, wherein the CBL is such that the CAVET is operable to prevent a current density of greater than 0.4 A/cm² from flowing through the CBL when the CAVET is biased in an off state with a source-drain voltage of about 400V or 400 V or less.

The present invention further discloses a method of fabricating an electronic device, comprising defining an aperture region and a sacrificial region in a first III-nitride layer; removing the first III-nitride layer in the sacrificial region; forming the III-nitride CBL around the aperture region, and forming one or more second III-Nitride layers on both the first III-Nitride layer and the III-Nitride current blocking layer. A mask can be formed over the aperture region prior to removing the first III-nitride layer in the sacrificial region. The mask can be removed prior to forming the second III-Nitride layers.

The CBL can be grown using ammonia ($NH_3$) based molecular beam epitaxy (MBE).

The CBL can be grown by a Metal Organic Chemical Vapor Deposition (MOCVD) growth technique by doping a Gallium Nitride layer with Mg dopants, wherein the III-nitride current blocking layer is activated by annealing in a hydrogen free environment at a temperature above 700° C. to make the III-nitride CBL a p-type III-nitride current blocking layer. The second III-nitride layers comprising AlGaN/GaN layers can then be regrown in ammonia-MBE which does not passivate the Mg acceptors, thereby preserving the p-type behavior of the III-nitride CBL.

BRIEF DESCRIPTION OF THE DRAWINGS

Referring now to the drawings in which like reference numbers represent corresponding parts throughout.

DETAILED DESCRIPTION OF THE INVENTION

Figure 1:
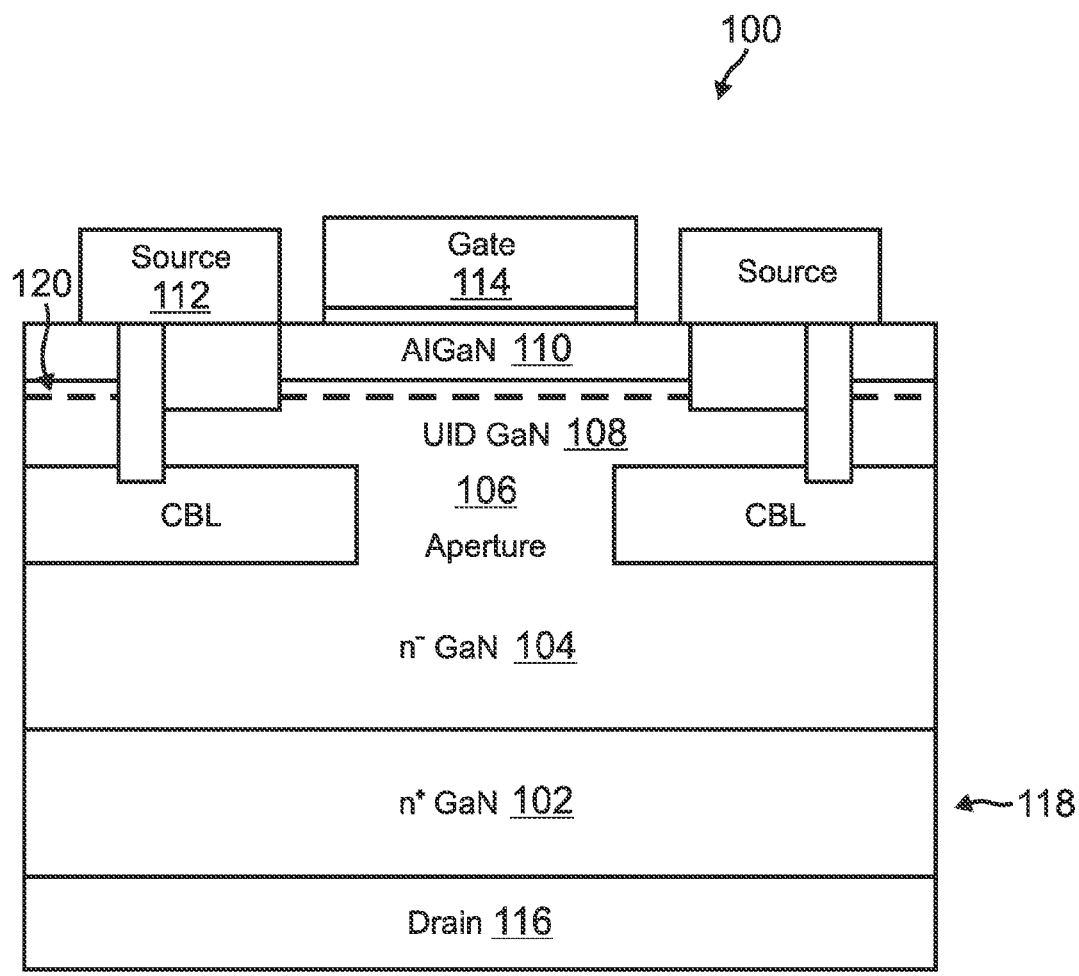
FIG. 1 is a cross-sectional schematic illustration of a CAVET.

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

A CAVET is a vertical device comprised of an n-type doped drift region to hold voltage and a horizontal 2DEG to carry current flowing from the source, horizontally under a planar gate, and then vertically to the drain through an aperture. A fundamental part of a CAVET is a CBL, which blocks current flow and causes any on-state device current to flow through the aperture. Previously, the CBL has been achieved by doping in-situ during growth in a metal-organic chemical vapor deposition (MOCVD) reactor or by ion implantation. The present invention, however, describes a CAVET with an ammonia-based MBE-grown p-GaN layer as the CBL. Specifically, an embodiment of the present invention features an active buried Mg-doped p-GaN layer for current blocking purposes in a CAVET. This structure is highly advantageous for high power switching applications and for any device that requires a buried active p-GaN layer for its functionality.

In CAVETs which employ a p-type current blocking GaN layer for which the p-type dopants are ion-implanted, the resulting p-type CBL typically is not an active p-type layer, since damage caused by the implant process results in a lower barrier to electron flow. That is, the number of holes in the layer is substantially less than that in an active p-type layer having the same density of p-type dopants. Subsequently, the barrier to electron flow through a non-active p-type CBL is smaller than that for an active p-type current blocking layer, resulting in higher leakage currents through the non-active p-type current blocking layer. For example, an active p-type CBL may have a barrier to electron flow through the layer that is at least 2 or at least 3 electron-Volts (eV). Many ion-implanted CBLs, or CBLs formed by doping GaN with dopants other than Mg, for example Fe-doped CBL's, have barriers to electron flow that are less than 1 eV. As used herein, an active p-type CBL is one in which the hole concentration is sufficiently large such that the barrier to electron flow through the layer is at least 1 eV. That is, the product of the p-type doping concentration and the percent of dopants which are active (i.e., result in a hole to be present in the valence band) is sufficiently large to ensure that the barrier to electron flow is at least 1 eV. In p-type III-N layers that are moderately or heavily damaged, for example III-N layers which are ion-implanted with Mg, or Mg-doped III-N layers that are passivated with hydrogen, for example MOCVD grown Mg-doped III-N layers, the hole concentration is typically relatively small, and thus the resulting barrier to electron flow is less than 1 eV.

Technical Description

A base structure for the CAVET includes an n-type GaN (n-GaN) aperture region grown on a thick, lightly doped, n-type drift region, which is etched back to the bottom n-GaN drift region using a mask to protect the aperture. On either side of the aperture is regrown p-GaN, which is regrown using an ammonia-assisted MBE technique. Thus, the CBLs are formed sandwiching the aperture region. The p-GaN layer is regrown in a hydrogen-free ambient and at low temperature, which ensures the active state of the Mg dopants used for p-type doping of GaN, since the layer is neither heavily damaged (as with ion-implanted layers) or passivated with hydrogen (as with MOCVD grown Mg-doped III-N layers). The regrowth is performed with the aperture region protected by a mask (i.e., a mask over the aperture region) to ensure no p-type regrowth takes place on top of the aperture region.

Subsequently, the mask is etched away and the surface is planarized, if needed. The device structure is completed by another regrowth of AlGaN/GaN channels to form the 2DEG.

Alternatively, the device can also be fabricated by creating the aperture by first growing a uniform p-type layer using the ammonia-assisted MBE technique. The aperture region is etched and an n-type current carrying aperture is regrown, followed by the AlGaN/GaN channel to form the 2DEG. The p-type layer thickness can range from 10 nm to about 5 microns, as needed by the device functionality, with a typical layer being in the range of about 100 to 500 nanometers. Thicker layers may be possible, but may complicate the fabrication process.

FIGS. 2(a)-(h) are schematic illustrations of the process flow used to fabricate a CAVET according to one embodiment of the present invention.

Figure 2A:
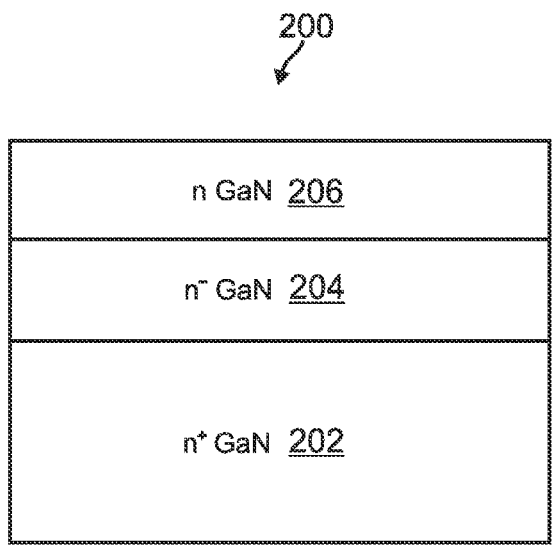
FIGS. 2(a)-(i) are cross-sectional schematic illustrations of the steps used to fabricate a CAVET according to one embodiment of the present invention.

FIG. 2(a) represents a base structure 200, including n$^+$-GaN 202, n$^-$-GaN 204, and n-GaN 206 layers, with the aperture layer being the n-GaN layer 206, all of which layers are grown using metalorganic chemical vapor deposition (MOCVD). In one example, the n$^-$-GaN layer 204 can be 6 micrometers thick, doped with Silicon to a doping concentration of $2\times10^{16}/cm^3$, and/or the n$^+$-GaN 202 can be an n$^+$-GaN substrate.

Figure 2B:
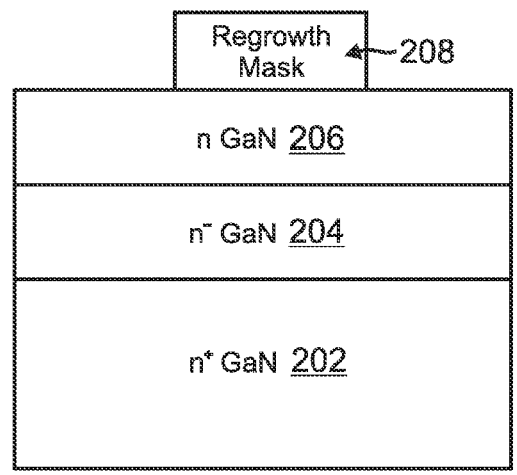

FIG. 2(b) represents the aperture being masked, wherein the regrowth mask 208 can be, for example, metal, Aluminum Nitride (AlN), or Silicon Dioxide (SiO$_2$).

Figure 2C:
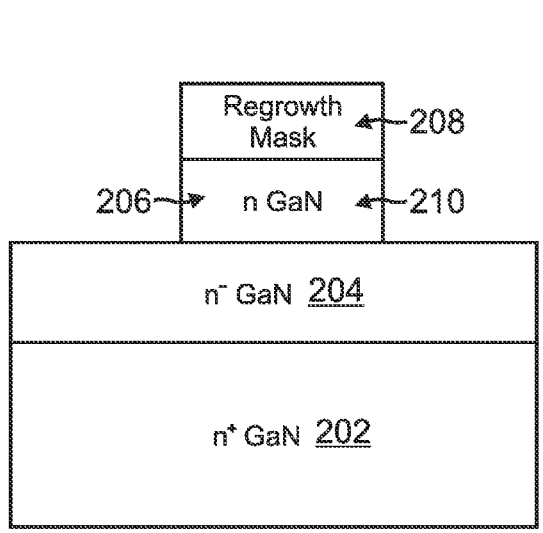

FIG. 2(c) represents the aperture region 210 of the n-GaN layer 206 being left intact under the mask 208, while the rest of the n-GaN layer 206 is etched away.

Figure 2D:
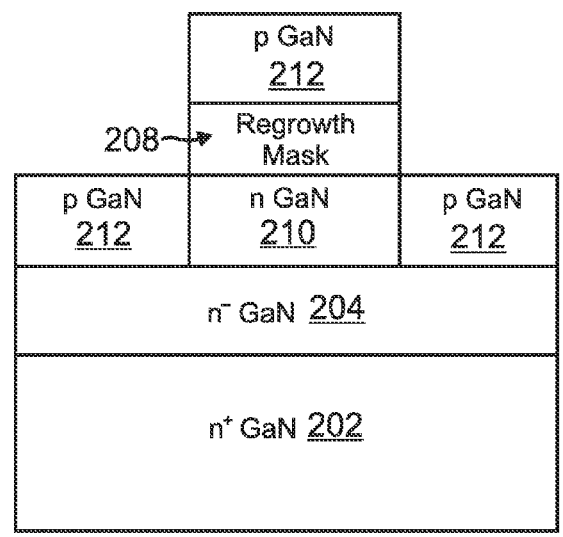

FIG. 2(d) represents the Mg-doped p-GaN 212 being grown using the ammonia-based MBE technique to form the CBLs. In one example, the p-GaN layer was regrown at a low temperature (840° C.), was active, and needed no further activation [5], and the regrowth was done with the AlN layer masking the aperture 210 to prevent any regrowth on the aperture region. Although a layer of p-GaN 212 is shown in FIG. 2(d) to be deposited over the regrowth mask, in some implementations the composition of the regrowth mask and the regrowth conditions are selected such that substantially no p-GaN is regrown over the regrowth mask.

Figure 2E:
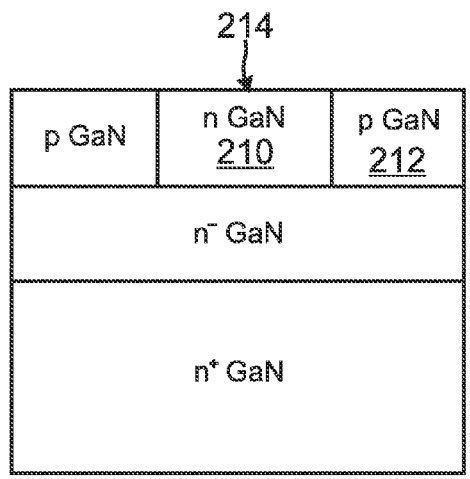

FIG. 2(e) represents the removal of the mask 208 and the planarization of the surface 214, if necessary. The mask can be etched away using KOH, for example.

Figure 2F:
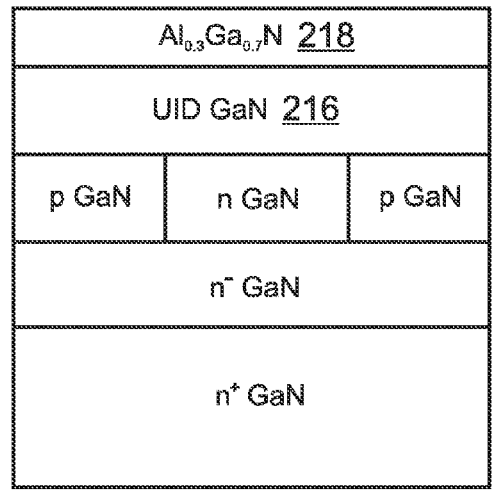

FIG. 2(f) represents regrowth by ammonia MBE, of the AlGaN/GaN layers 216, 218 to form the channel with the 2DEG. For example, the step can comprise the regrowth of a GaN layer 216 (e.g., UID GaN) and an Al$_{0.3}$Ga$_{0.7}$N layer 218 using the ammonia-based MBE technique.

Figure 2G:
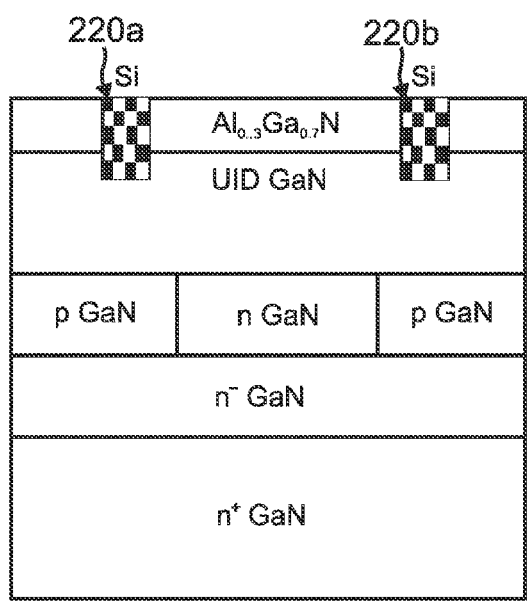

FIG. 2(g) represents Si implants 220a, 220b being made for the source contacts 222 into the Al$_{0.3}$Ga$_{0.7}$N layer 218 and the GaN layer 216, followed by an MOCVD activation anneal. The drain contact 224 (see FIG. 2(i)) can be formed at the back using Ti/Au/Ni contact, for example.

Figure 2H:
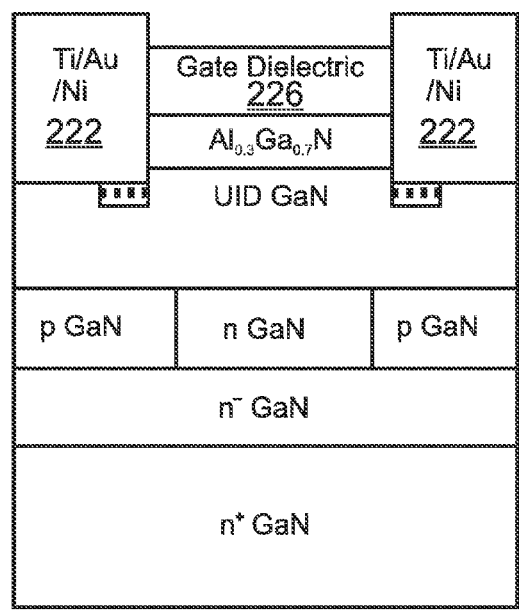

FIG. 2(h) represents deposition of the gate dielectric 226 by, e.g., atomic layer deposition (ALD), and the deposition of the source metals 222 (e.g, Ti/Au/Ni).

Figure 2I:
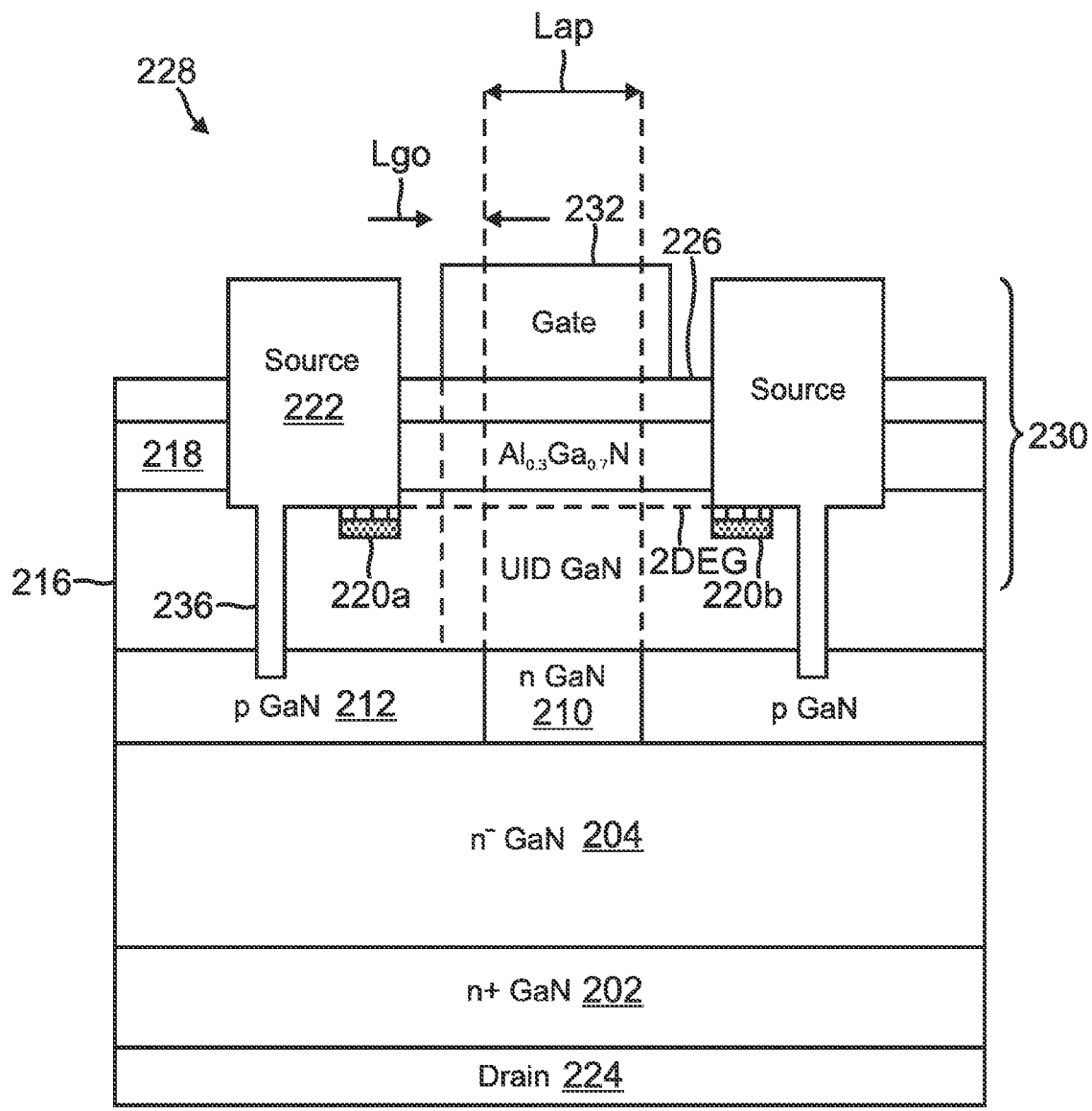

The end result of this process flow is a CAVET with an ammonia-based MBE regrown active buried p-type layer 212, as illustrated in FIG. 2(i).

FIG. 2(i) illustrates a CAVET 228 including a channel region 230, the aperture region 210 (e.g., n-type GaN) sandwiched between the III-nitride CBL 212, the drift region 204; and the gate 232. The channel 230 can comprise a 2DEG confined in a GaN layer 216 by an AlGaN barrier layer 218 on or above the GaN layer 216. An n-type doping concentration in the drift region 204 can be less than an n-type doping concentration in the aperture region 210. The gate 232 can comprise a Ni/Au/Ni gate 232 deposited over ALD deposited Al$_2$O$_3$ gate dielectric 224. In FIG. 2(i), the CBL 212 and the source 222 are electrically connected 236 such that there is no bias across any part of the source 222 and the CBL 212. The electrical connection can be formed by etching a trench through to the p-GaN layer 212 prior to deposition of the source metal, and then depositing the source metal in the trench as well as over the Si implanted regions 220a and 220b.

Depending on the growth parameters for the CBL, as well as conditions and parameters used for growth and deposition of subsequent device layers, the CBL may have a barrier to electron flow that is at least 1 eV, at least 2 eV, or at least 3 eV. While a 1 eV barrier may be sufficient for device operation at lower voltages, for example source-drain voltages of less than 100V, a larger barrier, such as at least 2 eV or at least 3 eV, may be preferable for operation at higher voltages, such as greater than 300V or greater than 600V.

Figure 3:
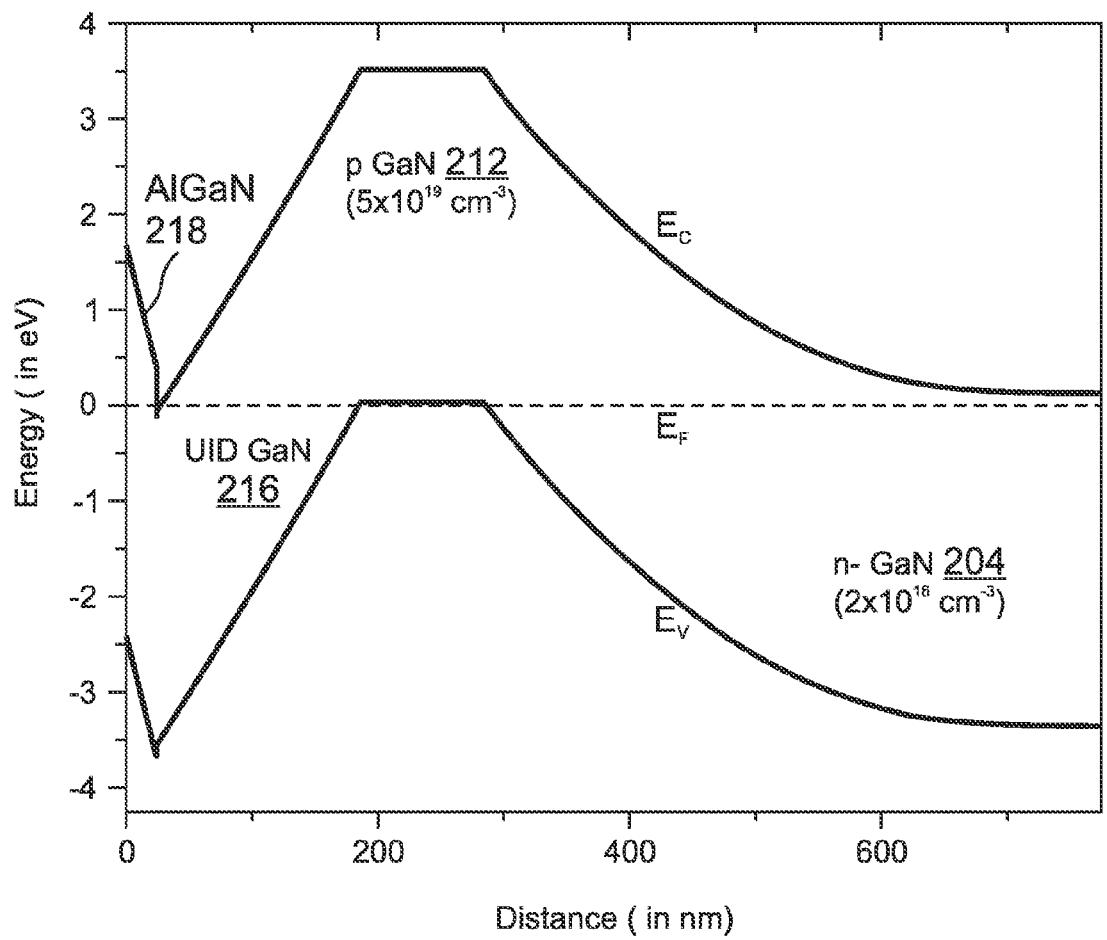
FIG. 3 plots the band structure of the CAVET fabricated according to the method of FIG. 2(a)-(i).

FIG. 3 shows a band diagram of a structure wherein a conduction band $E_c$ offset and valence band $E_F$ offset between the CBL and the energy of the electrons and holes, respectively, in the 2DEG (e.g., Fermi level, $E_F$), can be at least 3 eV. In FIG. 3, the CBL 212 is a p-GaN layer with a doping level of $5\times10^{19}$ cm$^{-2}$, the GaN channel layer 216 is UID GaN, the drift region 204 comprises n-GaN with $2\times10^{16}$ cm$^{-3}$ doping. The AlGaN 218 over the channel layer 216 is also shown.

Characterization

Figure 4A:
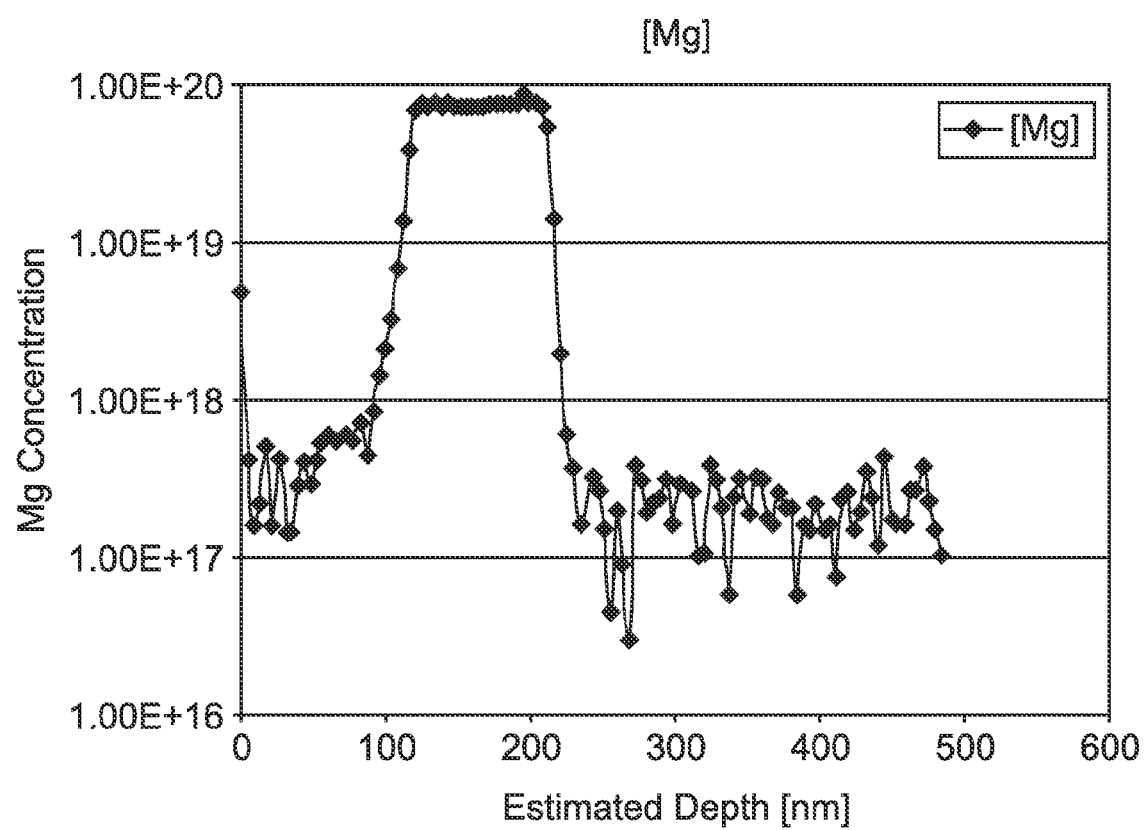
FIG. 4(a) plots Mg concentration vs. estimated depth through the CAVET structure and measured by Secondary Ion Mass Spectroscopy (SIMS).

SIMS done on the CAVET structure of FIG. 2(i) showed a very well behaved (e.g., sharp) doping profile, as shown in FIG. 4(a).

The blocking capacity of the p-layer (CBL, 212) in the CAVET of FIG. 2(i) can be measured.

Figure 4B:
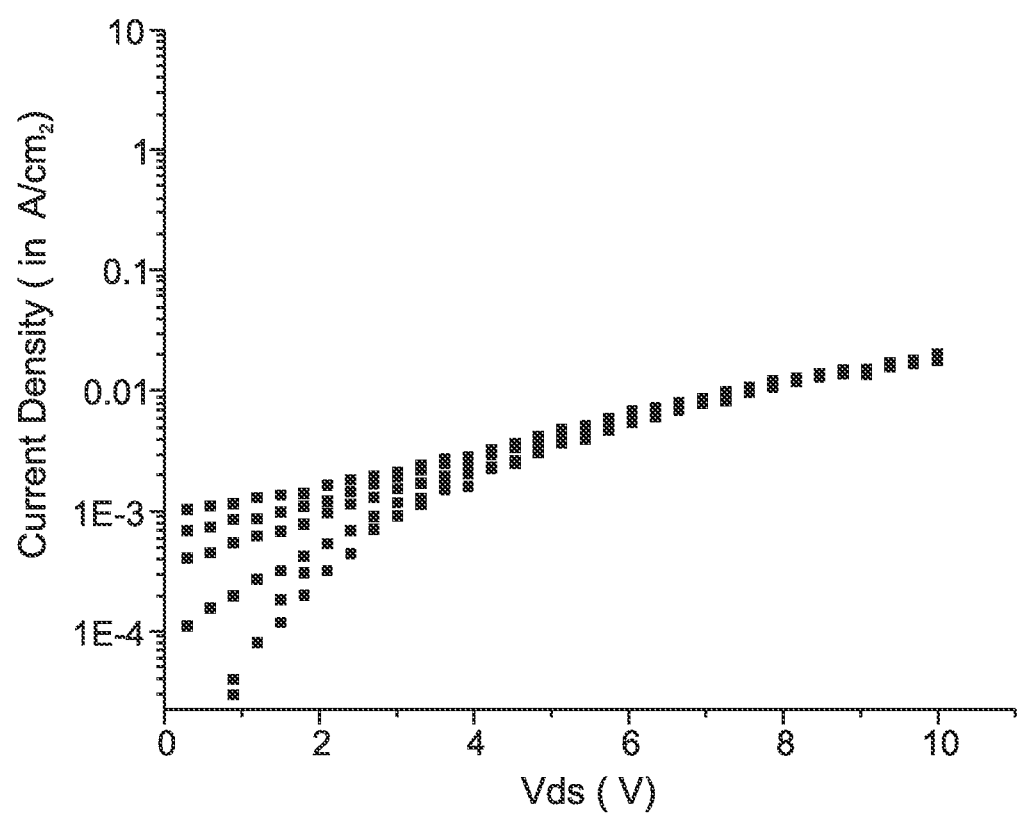
FIG. 4(b) plots current density as a function of drain-source voltage ($V_{ds}$) for a CAVET with a zero aperture and active p-GaN CBL.

FIG. 4(b) plots the current density as a function of V$_{ds}$ through a p-GaN CBL of a zero aperture CAVET.

Figure 5A:
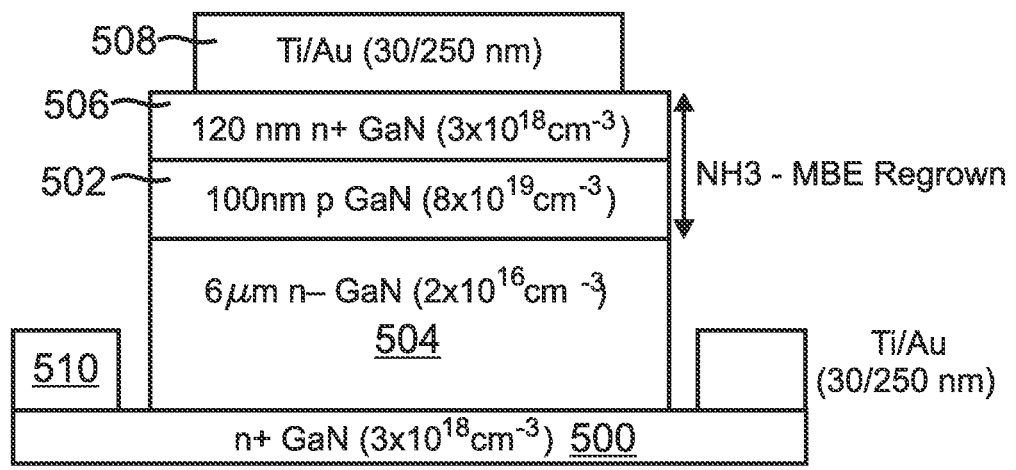
FIG. 5(a) is a cross-sectional schematic of a structure for measuring the CBL blocking capacity of the p-GaN CBL in the CAVET.

In addition, the blocking capacity of the p-layer can be verified separately by fabricating an n-p-n structure on a GaN substrate 500 (e.g, n$^+$-GaN with $3\times10^{18}$ cm$^{-3}$ doping), as shown in FIG. 5(a).

The structure of FIG. 5(a) comprises a p-GaN layer 502 (e.g., 100 nm thick, with $8\times10^{19}$ cm$^{-3}$ doping) between an n-GaN layer 504 (e.g., 6 µm thick with $2\times10^{16}$ cm$^{-3}$ doping) and an n$^+$-GaN layer 506 (e.g., 120 nm thick with $3\times10^{18}$ cm$^{-3}$ doping). This structure is contacted with contacts 508, 510, e.g., Ti/Au (30/250 nm) contacts. The layers 506 and 502 were regrown by ammonia Molecular Beam Epitaxy (MBE).

Figure 5B:
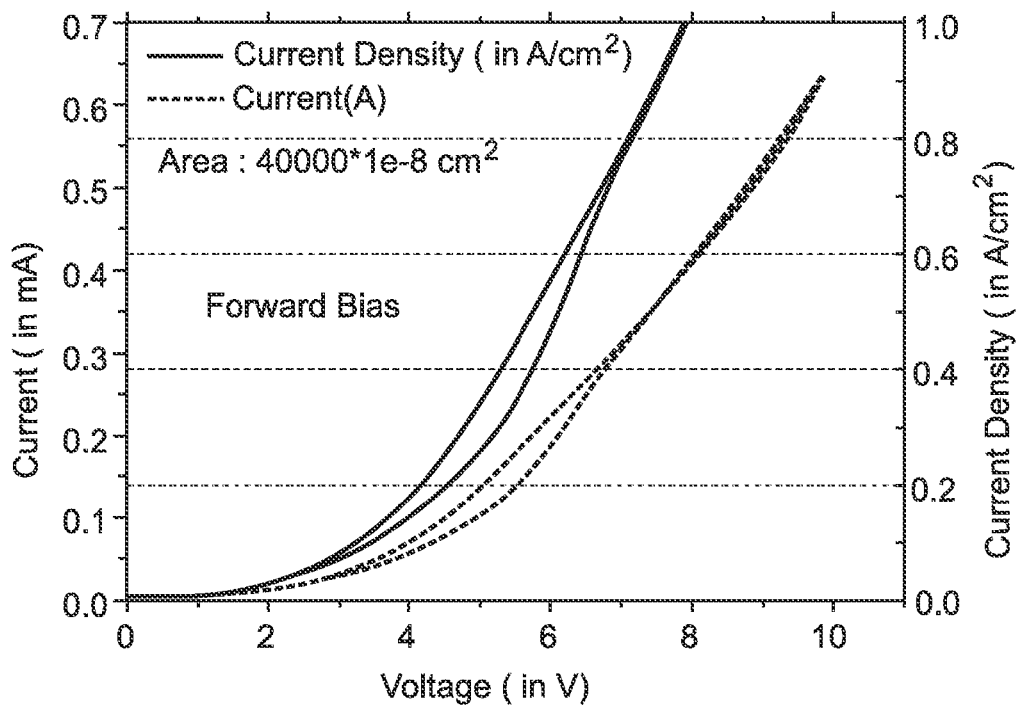
FIG. 5(b) is a graph of the forward bias current-voltage (I-V) characteristics of the structure in FIG. 5(a)
Figure 5C:
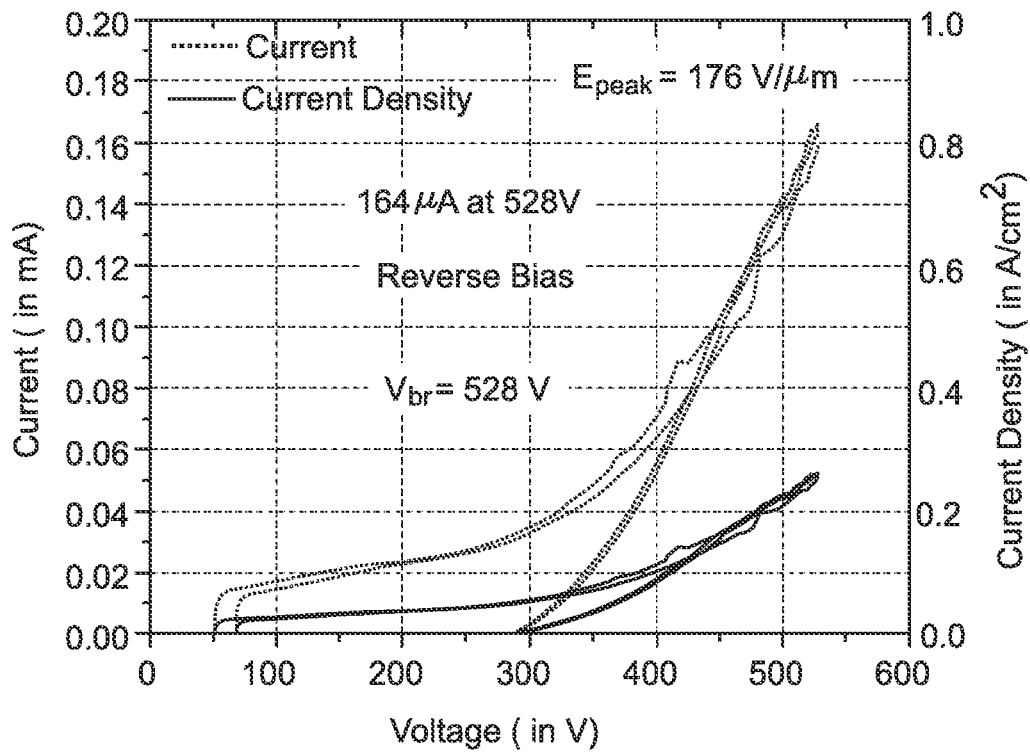
FIG. 5(c) is a graph of the reverse bias I-V characteristics of the structure in FIG. 5(a).

FIG. 5(b) shows the forward bias I-V, and FIG. 5(c) shows the reverse bias I-V characteristic, measured between contacts 508, 510 of the structure in FIG. 5(a). The leakage current of the p-n diode formed by layers 504 and 502 was 164 µA at 528 V in reverse bias, with a peak field of $E_{peak}=176$ V/µm and a breakdown voltage of 528 V.

Figure 5D:
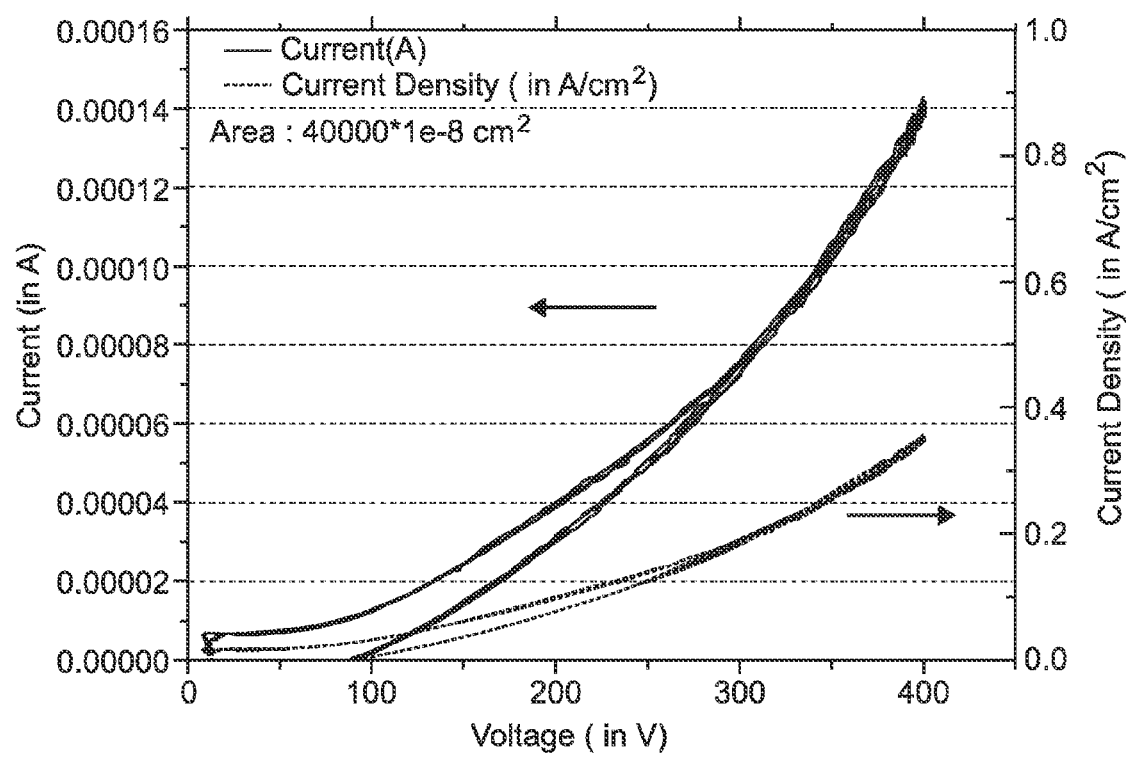
FIG. 5(d) is a graph of the I-V characteristics of a structure similar to that shown in FIG. 5(a), reflecting the I-V characteristics of the CAVET having the structure of FIG. 2(i), plotting current (Amps, A) and current density (A/cm$^2$) as a function of voltage, wherein the back p-n diode has a leakage current of 140 µA or 0.35 A/cm$^2$ at a reverse bias voltage of 400V.

Another diode having a similar structure to the one shown in FIG. 5(a) has a leakage current of 140 µA or 0.35 A/cm$^2$ at 400V in reverse bias, as shown in FIG. 5(d). FIG. 5(d) is a graph of the I-V characteristics of the n/p/n structure on the GaN substrate, with the back p/n diode 512 (comprising layers 504 and 502) under reverse bias showing 140 µA current (and a current density of less than 0.4 A/cm$^2$) at 400V applied across the back p/n diode 512. As such, the CAVET of FIG. 2(i) having such a CBL, and lacking any other off-state leakage current paths, would have a current density of less than 0.4 A/cm$^2$ flowing through the CBL when the device is biased in the off state with a source-drain voltage of 400V or less.

FIGS. 6-9 are measurements performed on the CAVET having the structure of FIG. 2(i).

Figure 6:
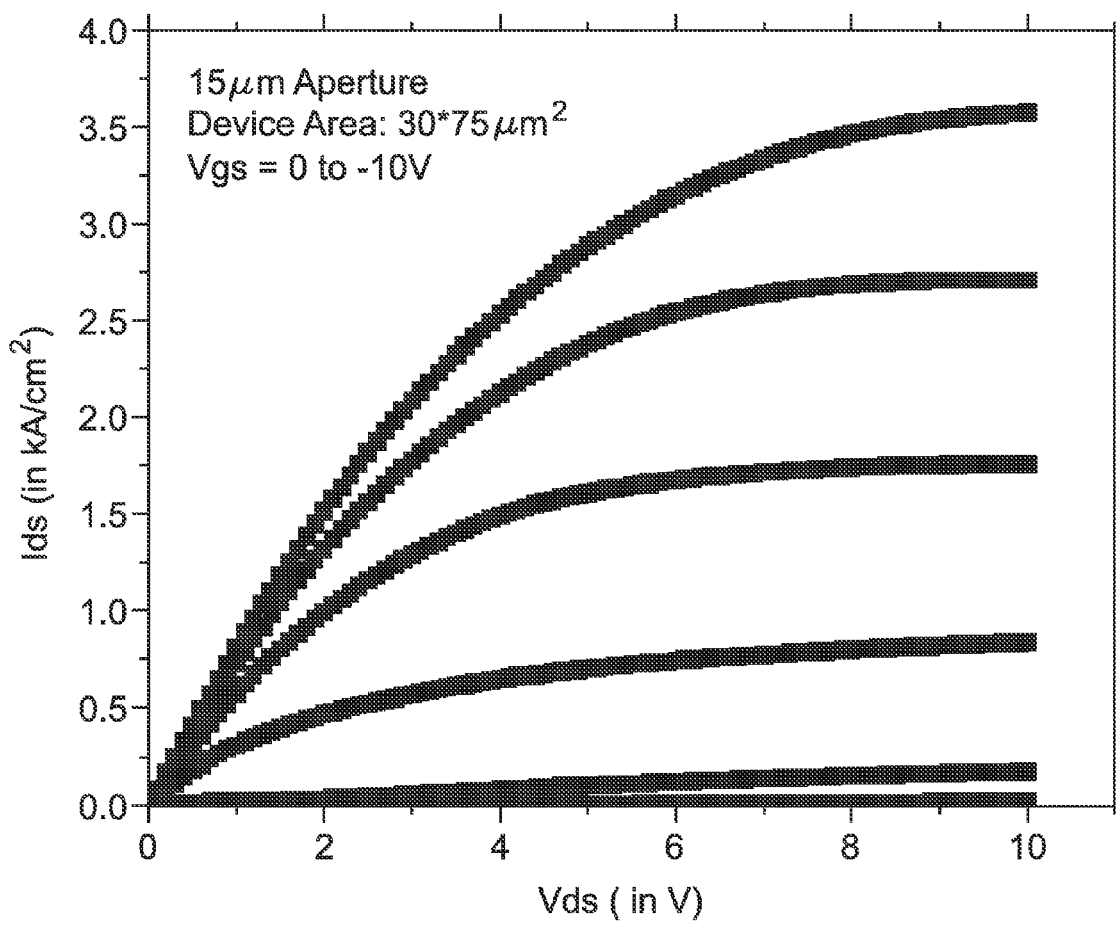
FIG. 6 is a graph of the direct current (DC) I-V characteristics of the CAVET, plotting drain-source current ($I_{ds}$) as a function of $V_{ds}$ for a device with aperture length $L_{ap}$=15 µm, 30 µm×75 µm device area, and wherein each curve is for a different gate source voltage (Vgs), as Vgs is ramped from 0 V to −10 V (Vgs=0V, −2V, −4V, −6V, −8V, −10V going from the top curve to the bottom curve).

The fabricated CAVET device with active p-CBL exhibits good transistor characteristics, with good channel modulation and a pinchoff of −10V, as shown in FIG. 6. FIG. 6 is a graph of the DC I-V characteristics of the CAVET, wherein the aperture's 210 length $L_{ap}$=15 μm, $V_{gate}$=0 to −10V, and $V_{step}$=−2V.

Figure 7:
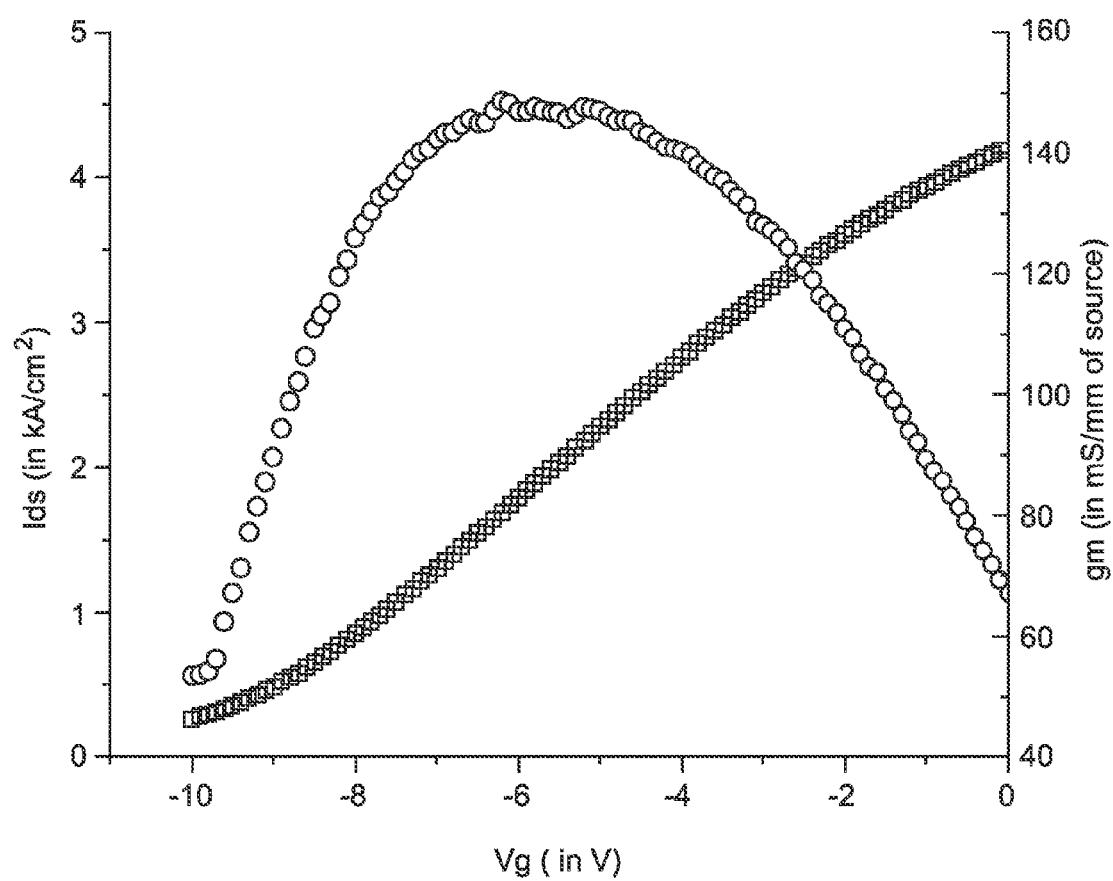
FIG. 7 is a graph plotting transfer characteristics (Ids as a function of gate voltage Vg) and gm for the CAVET with an aperture length $L_{ap}$=15 µm and gate to aperture overlap $L_{go}$=4 µm.

FIG. 7 shows a 75 μm wide CAVET device 228 with a 15 μm aperture 210 length, registered a current of 3.6 kA/cm$^2$, where the active area of 30 μm×75 μm was measured from source implant region 220a to source implant region 220b (including the implant opening). A low on resistance ($R_{on}$) of 1.22 mΩ cm$^2$ was obtained from this device. A peak transconductance (gm) of 148 mS/mm (of the source) was obtained from the transfer characteristics of the device, as shown in FIG. 7.

Figure 8:
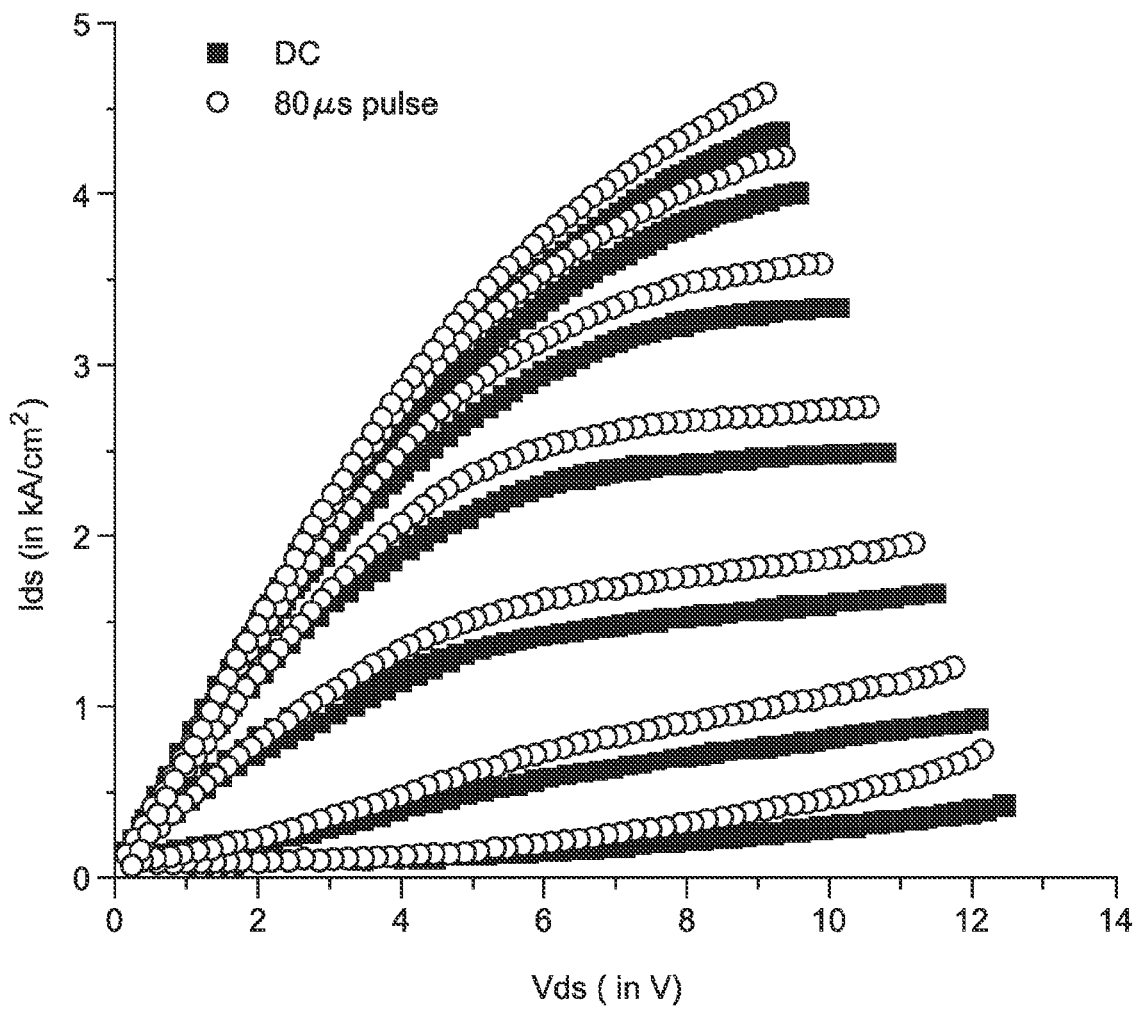
FIG. 8 is a graph plotting $I_d$, as a function of $V_{ds}$ for the CAVET, for DC and pulsed operation, showing no current collapse using a 80 µs pulse, for Vgs=0 to −10V using a step of $V_{step}$=−2V (from top to bottom curve) and wherein $L_{ap}$=15 µm and $L_{go}$=4 µm.

Pulsed $I_{DS}$-$V_{DS}$ characteristics, measured with gate pulsed at 80 μs pulse width, showed no current collapse, as shown in FIG. 8.

Figure 9:
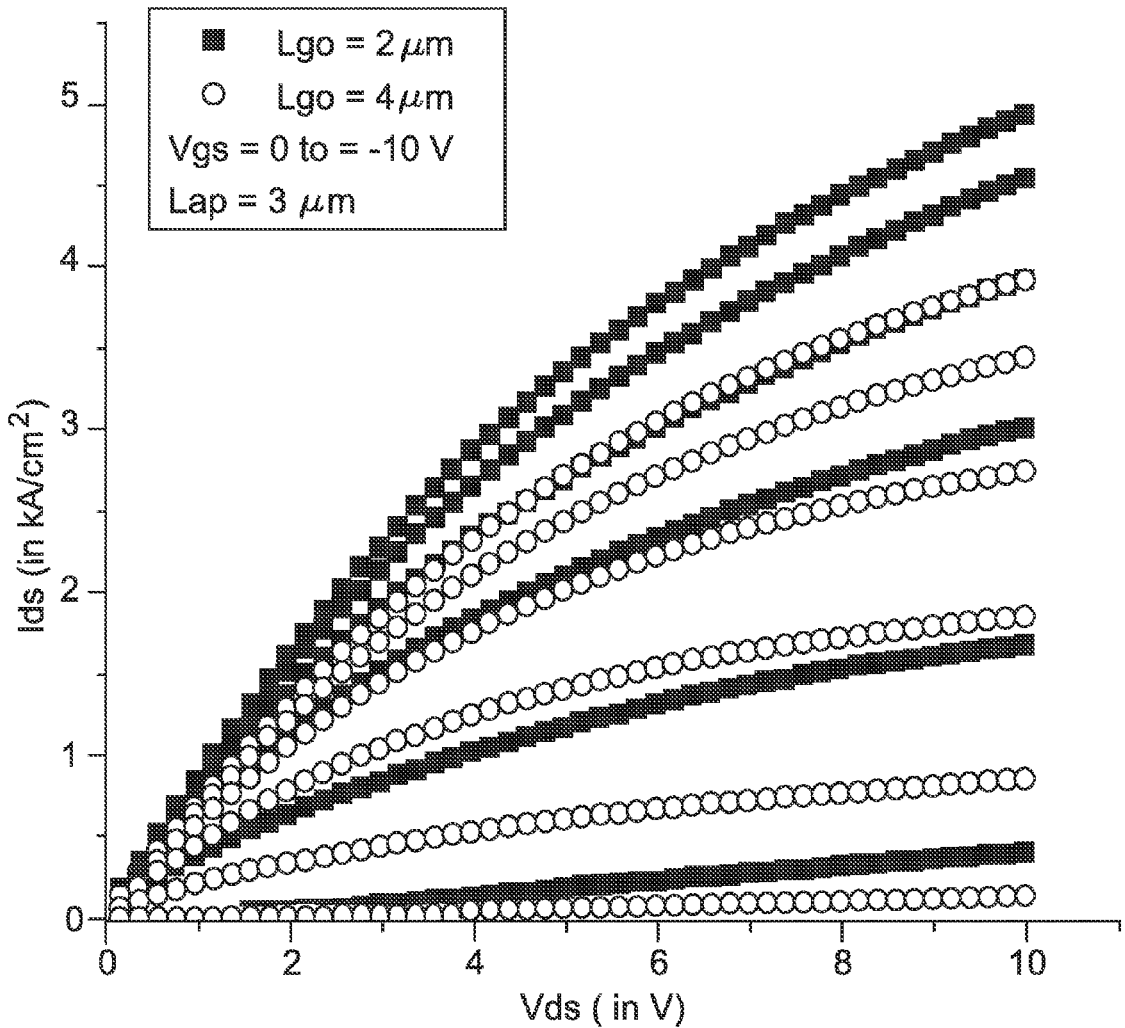
FIG. 9 plots $I_{ds}$ as a function of $V_{ds}$ for the CAVET having $L_{go}$=2 µm and $L_{go}$=4 µm, wherein $V_{gs}$=0 to −10 V ($V_{gs}$=0V, −2V, −4V, −6V, −8 V, −10 V going from the top curve to the bottom curve) and $L_{ap}$=3 µm, and showing increased leakage current as $L_{go}$ decreases.

With decreasing $L_{go}$ (the gate-aperture overlap), the leakage current increased due to unmodulated electrons flowing from source through the aperture to the drain, as shown in FIG. 9.

Process Steps

Figure 10:
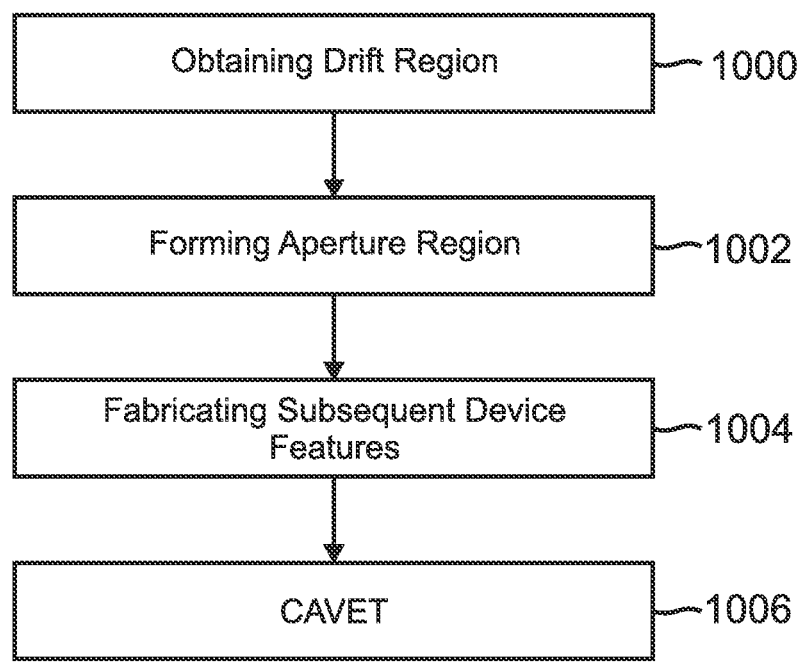
FIG. 10 is a flowchart illustrating a method of fabricating a CAVET according to one or more embodiments of the present invention.

FIG. 10 illustrates an example of a method of forming or fabricating a CAVET including an aperture region in a III-nitride CBL, wherein a barrier to electron flow through the III-nitride CBL is, for example, at least 1 electron-Volt. The method can comprise one or more of the following steps.

Block 1000 represents obtaining, growing, or forming a drift region (e.g., n$^−$ GaN). The drift region can be formed on or above an n$^+$-type GaN substrate, for example.

Block 1002 represents forming an aperture region comprised of a first III-nitride layer. The first III-nitride layer can be an n-type III-nitride or n-type GaN layer 206, e.g., formed on the drift region.

The step can comprise defining an aperture region and a sacrificial region in the first III-nitride layer (e.g., by forming a mask over the aperture region) prior to removing (e.g., etching) the first III-nitride layer in the sacrificial region. The first III-nitride layer remaining after removal of the sacrificial region can be the aperture region. Then, a III-nitride CBL (e.g., p-type III-nitride) can be formed around or on either side of the aperture region, e.g., in areas where the first III-nitride layer was removed.

Alternatively, a uniform p-type layer can be grown using the ammonia-assisted MBE technique, on the drift region of the CAVET. The aperture region can then be etched in the p-type layer. Then, an n-type current carrying aperture region can be regrown in the etched aperture formed in the p-type layer.

The p-type layer thickness can have a thickness of 10 nm or more (for example), as needed for device functionality. The current blocking layer's thickness (e.g., at least 10 nanometers), hole concentration, and composition, can be such that the barrier to electron flow has the desired value (e.g., at least 1 eV, at least 2 eV, or at least 3 eV, for example).

The p-type III-nitride CBL can be grown with dopants and under growth conditions wherein the p-type III-nitride layer's dopants are activated or the p-type III-nitride layer is active. The growth conditions can include a low temperature (e.g., at or below 900° C. or at 500-900° C.) and a hydrogen-free ambient, for example. The CBL can be grown using ammonia (NH$_3$) based molecular beam epitaxy (MBE).

The p-type current blocking layer can be grown by a Metal Organic Chemical Vapor Deposition (MOCVD) growth technique by doping the Gallium Nitride layer with Mg dopants, and activated by annealing in a hydrogen free environment at >700° C. to make the current blocking layer p-type. Then the top AlGaN/GaN layers (216, 218 in FIG. 2 or second III-nitride layers in Block 1004) can be regrown in ammonia-MBE, which does not passivate the Mg acceptors, thereby preserving the p-type behavior of the current blocking layer.

Block 1004 represents growing and fabricating subsequent device features, including a III-nitride active region or channel (and source, drain, gate) for the CAVET, on or above or below the p-type III-nitride layer or CBL and the first III-nitride layer. The step can comprise forming one or more second III-nitride layers on both the first III-nitride layer and the III-nitride CBL. The III-nitride active region can comprise the second III-nitride layer. The mask 208 can be removed prior to forming the second III-nitride layer.

The growing and fabricating of subsequent device features can be under conditions wherein the p-type III-nitride layer's dopants remain activated.

Block 1006 represents the end result, a III-nitride CAVET 228 as illustrated in FIG. 2(*i*). The CAVET 228 can include an aperture region 210 in a III-nitride CBL 212, wherein a barrier to electron flow through the III-nitride CBL is at least 1 or 2 electron-Volt(s). The III-nitride CBL can be an active p-type doped III-nitride layer 212 (e.g., active p-type GaN or active Magnesium doped layer), and/or have a hole concentration greater than a similar p-type III-nitride layer doped by ion implantation. The aperture region can comprise n-type GaN.

The CBL can cause on-state current to flow through the aperture region.

The device can further comprise an active region or channel 230 comprising a 2DEG confined in a GaN layer 216 by an AlGaN barrier layer 218; a source 222 contact to the GaN layer 216 and the AlGaN barrier layer 218; a drift region 204, comprising one or more n-type GaN layers, wherein the CBL is between the drift region 204 and the active region or channel 230; and a drain contact 224 to the drift region 204, wherein a gate 232 is positioned on or above the active region or channel 230 and the aperture 210, to modulate a current between the source and the drain.

The n-type III-nitride drift region 204 is between the aperture region 210 and the drain 224, An n-type doping concentration in the drift region 204 can be less than an n-type doping concentration in the aperture region 210.

The source 222 and the CBL can be electrically connected 236 such that there is no bias across any part of the source and the CBL.

The III-nitride CAVET can comprise a CBL, wherein the CAVET is operable to prevent a current density of greater than 0.4 A/cm$^2$ from flowing through the CBL when the CAVET is biased in an off state with a source-drain voltage of about 400 V, or 400V or less (see also FIGS. 3-9).

Advantages and Improvements

The present invention includes the following advantages and improvements over the prior art:

1. An active buried Mg-doped GaN layer can be grown in situ without any need of an activation process.

2. The CBL is a homoepitaxial blocking layer.

3. The CAVET does not need implanted GaN as the CBL.

4. The CAVET provides an ability to collect any holes that are generated during the operation of the device, so as to increase device reliability.

5. The method/device provides an effective manner to connect the source to the CBL, so that there is no bias across any part of the source and the CBL, preventing electron injection from the source to the drain.

6. The method/device enables smooth high frequency switching because of the predictable response of the p-type CBL, as compared to CBLs created using implantation to create damage.

Another benefit to the present invention is the simplicity in processing of the device. The biggest challenge in a device like the CAVET is the CBL. The most cost-effective CBL is a p-GaN layer grown on top of the n-drift region. When the p-n junction gets reverse biased during device operation, it can hold a very large voltage, which is desirable for the working of the device. The biggest challenge is to get an active buried p-layer as subsequent AlGaN/GaN layers are grown on top to form the 2DEG. However, under hydrogen ambient at high regrowth temperatures (~1160° C.), a p-layer is not active. The present invention, on the other hand, ensures a buried active p-GaN layer in the structure, which makes it functional and more effective from a device performance point of view.

Nomenclature

The terms "(AlInGaN)" "(In,Al)GaN", or "GaN" as used herein (as well as the terms "III-nitride," "Group-III nitride", or "nitride," used generally) refer to any alloy composition of the (Ga,Al,In,B)N semiconductors having the formula $Ga_wAl_xIn_yB_zN$ where $0 \le w \le 1$, $0 \le x \le 1$, $0 \le y \le 1$, $0 \le z \le 1$, and $w+x+y+z=1$. These terms are intended to be broadly construed to include respective nitrides of the single species, Ga, Al, In and B, as well as binary, ternary and quaternary compositions of such Group III metal species. Accordingly, it will be appreciated that the discussion of the invention hereinafter in reference to GaN and AlGaN materials is applicable to the formation of various other (Ga,Al,In,B)N material species. Further, (Ga,Al,In,B)N materials within the scope of the invention may further include minor quantities of dopants and/or other impurity or inclusional materials.

REFERENCES

The following references are incorporated by reference herein:

[1] S. Chowdhury et al., Presented at EMC 2008, Santa Barbara.
[2] Srabanti Chowdhury, Brian L. Swenson and Umesh K. Mishra, "Enhancement and Depletion Mode AlGaN/GaN CAVET With Mg-Ion-Implanted GaN as Current Blocking Layer," IEEE Electron Device Letters, Vol. 29, No. 6, pp. 543-545, June 2008.
[3] Srabanti Chowdhury, "AlGaN/GaN CAVETs for high power switching application," Ph.D. thesis, University of California Santa Barbara, December 2010, including the following pages: cover, iii, viii-xiv, and 154-155.
[4] "p-n junctions on Ga-face GaN by NH3 molecular beam epitaxy with low ideality factors and low reverse currents," C. A. Hurni. et al, Applied Physics Letters Vol. 97, 222113, November 2010.
[5] S. Chowdhury et al, IEEE EDL, Vol. 29, 2008.
[6] S. Chowdhury et al, DRC, South Bend, July 2010.

CONCLUSION

This concludes the description of the preferred embodiments of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method of fabricating a current aperture vertical electron transistor (CAVET), comprising:
defining a current aperture region and a sacrificial region in a first III-nitride layer;
removing the first III-nitride layer in the sacrificial region;
forming a III-nitride current blocking layer around the current aperture region;
forming one or more second III-nitride layers on both the first III-nitride layer and the III-nitride current blocking layer; and
electrically connecting a source of the CAVET and the III-nitride current blocking layer such that, during the CAVET's operation, there is no bias between the source and the III-nitride current blocking layer.

2. The method of claim 1, wherein the III-nitride current blocking layer is grown using ammonia ($NH_3$) based molecular beam epitaxy (MBE).

3. The method of claim 1, further comprising forming a mask over the current aperture region prior to removing the first III-Nitride layer in the sacrificial region.

4. The method of claim 3, further comprising removing the mask prior to forming the second III-Nitride layers.

5. The method of claim 1, wherein:
the III-nitride current blocking layer is grown by a Metal Organic Chemical Vapor Deposition (MOCVD) growth technique by doping a Gallium Nitride layer with Mg dopants,
the III-nitride current blocking layer is activated by annealing in a hydrogen free environment at a temperature above 700° C. to make the III-nitride current blocking layer a p-type III-nitride current blocking layer, and
the second III-nitride layers comprising AlGaN/GaN layers are regrown in ammonia-MBE which does not passivate the Mg acceptors, thereby preserving the p-type behavior of the III-nitride current blocking layer.

6. The method of claim 1, further comprising:
growing and doping the III-nitride current blocking layer comprising a hole concentration and composition wherein the III-nitride current blocking layer provides a barrier to electron flow, vertically through the III-nitride current blocking layer, in a range of 1-2 electron-Volts.

7. The method of claim 1, further comprising:
growing and doping the III-nitride current blocking layer comprising a hole concentration and composition wherein the III-nitride current blocking layer provides a barrier to electron flow, vertically through the III-nitride current blocking layer, of at least 2 electron-Volt.

8. The method of claim 1, further comprising growing and doping the III-nitride current blocking layer to form an active p-type doped III-nitride layer.

9. The method of claim 8, wherein the III-nitride current blocking layer is an active p-type GaN layer.

10. The method of claim 9, further comprising doping the III-nitride current blocking layer with Magnesium to form the p-type GaN layer comprising an active Magnesium doped layer.

11. The method of claim 1, wherein the current aperture region comprises n-type GaN.

12. The method of claim 1, further comprising:
forming a drain; and
forming an n-type III-nitride drift region between the current aperture region and the drain, wherein an n-type doping concentration in the n-type III-nitride drift region is less than an n-type doping concentration in the current aperture region.

13. The method of claim 1, further comprising:

forming an active region or channel comprising a two dimensional electron gas confined in a GaN layer by an AlGaN barrier layer;

depositing the source comprising a source contact to the GaN layer and the AlGaN barrier layer;

forming a drift region, comprising one or more n-type GaN layers, wherein the III-nitride current blocking layer is between the drift region and the active region or channel;

depositing a drain contact to the drift region; and positioning a gate on or above the active region or channel and the current aperture region, to modulate a current between the source contact and the drain contact.

14. The method of claim 13, further comprising:

selecting a lateral position of the gate above the channel and the current aperture region.

15. The method of claim 14, further comprising:

selecting a lateral extension of the gate over the channel and the current aperture region to control a peak electric field in the CAVET; and providing a dielectric layer between the lateral extension and the channel.

16. The method of claim 1, wherein the current blocking layer causes on-state current to flow through the current aperture region.

17. The method of claim 1, wherein the III-nitride current blocking layer is such that the CAVET is operable to prevent a current density of greater than 0.4 A/cm$^2$ from flowing through the current blocking layer when the CAVET is biased in an off state with a source-drain voltage of 400V.

18. The method of claim 1, wherein the III-nitride current blocking layer surrounds and is all around the current aperture region.

19. The method of claim 1, further comprising:

forming a mask over the current aperture region;

removing the first III-Nitride layer in the sacrificial region; and growing a p-type Gallium Nitride (GaN) layer by Metal Organic Chemical Vapor Deposition (MOCVD) and selecting growth conditions wherein no p-type GaN is grown over the mask and the III-nitride current blocking layer, comprising the p-type GaN around the current aperture region, is formed.

* * * * *